(12) United States Patent
Venkataraman

(10) Patent No.: US 10,795,002 B2
(45) Date of Patent: *Oct. 6, 2020

(54) HIGH SPEED ILLUMINATION DRIVER FOR TOF APPLICATIONS

(71) Applicant: Texas Instruments Incorporated, Dallas, TX (US)

(72) Inventor: Jagannathan Venkataraman, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/128,040

(22) Filed: Sep. 11, 2018

(65) Prior Publication Data

US 2019/0094340 A1 Mar. 28, 2019

Related U.S. Application Data

(63) Continuation of application No. 14/856,205, filed on Sep. 16, 2015, now Pat. No. 10,073,167.

(30) Foreign Application Priority Data

May 22, 2015 (IN) .......................... 2556/CHE/2015

(51) Int. Cl.
*H03M 1/66* (2006.01)
*G01S 7/484* (2006.01)
(Continued)

(52) U.S. Cl.
CPC ............. *G01S 7/484* (2013.01); *H03M 3/358* (2013.01); *G01S 17/89* (2013.01); *H03M 1/0682* (2013.01); *H03M 3/50* (2013.01); *H03M 3/502* (2013.01)

(58) Field of Classification Search
CPC ...... H03M 1/0682; H03M 3/50; H03M 3/358; H03M 3/502; H03M 1/745;
(Continued)

(56) References Cited

U.S. PATENT DOCUMENTS 5,218,364 A 6/1993 Kumazawa et al.
5,296,857 A * 3/1994 Carobolante ......... H03M 1/745
341/127

(Continued)

FOREIGN PATENT DOCUMENTS

CN 201986218 9/2011
CN 202838918 3/2013
(Continued)

OTHER PUBLICATIONS

Supplementary European Search Report in corresponding European Patent Application No. EP16800557, dated May 18, 2018 (3 pages).
(Continued)

*Primary Examiner* — Linh V Nguyen
(74) *Attorney, Agent, or Firm* — John R. Pessetto; Charles A. Brill; Frank D. Cimino

(57) ABSTRACT

The disclosure provides a circuit. The circuit includes an amplifier and a digital to analog converter (DAC). The amplifier receives a reference voltage at an input node of the amplifier. The DAC is coupled to the amplifier through a refresh switch. The DAC includes one or more current elements. Each current element of the one or more current elements receives a clock. The DAC includes one or more switches corresponding to the one or more current elements. A feedback switch is coupled between the one or more switches and a feedback node of the amplifier. The DAC provides a feedback voltage at the feedback node of the amplifier.

20 Claims, 5 Drawing Sheets

Figure 1:
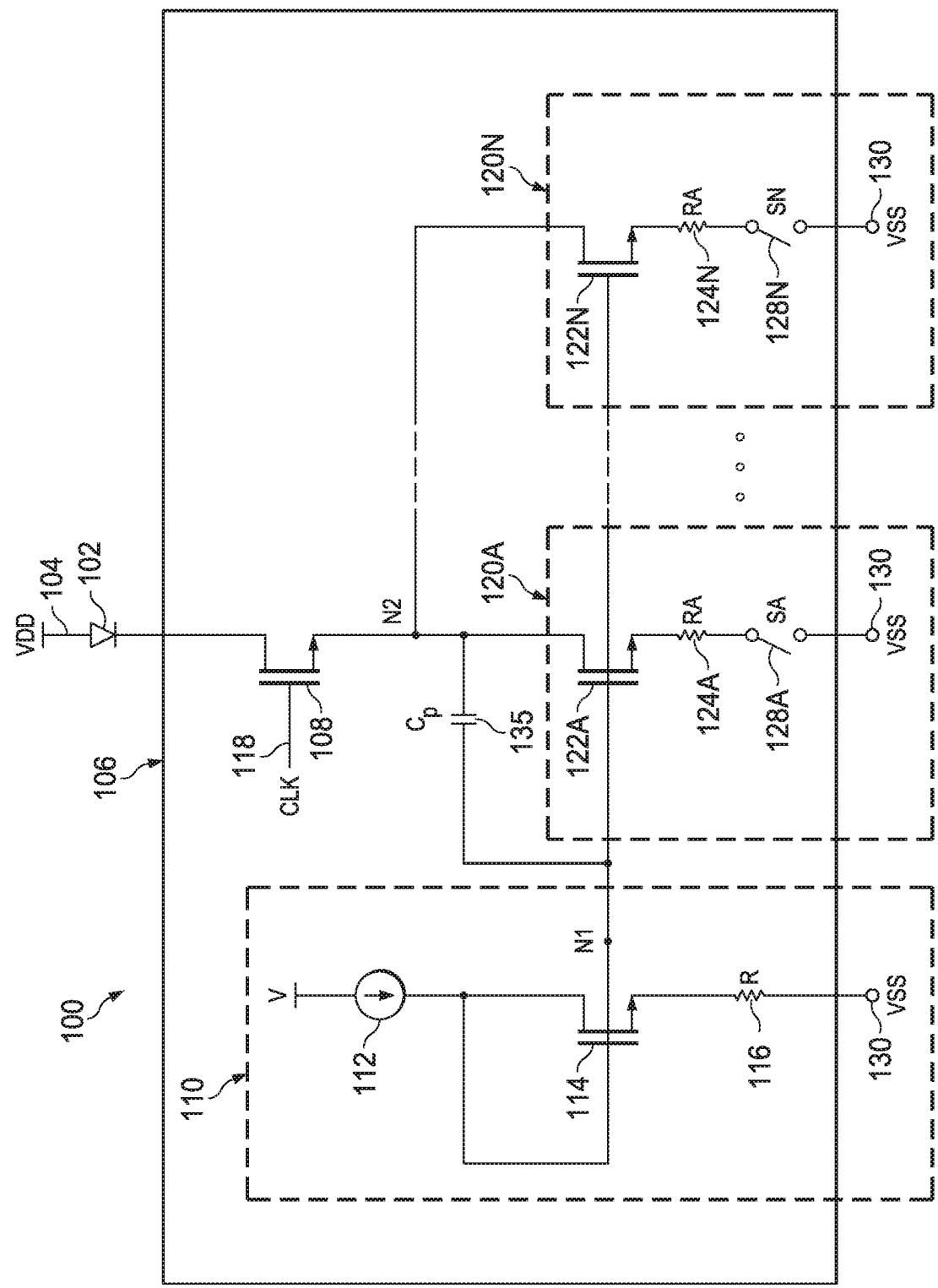

(51) Int. Cl.
*H03M 3/00* (2006.01)
*H03M 1/06* (2006.01)
*G01S 17/89* (2020.01)

(58) Field of Classification Search
CPC . H03M 2201/8128; H03M 2201/8132; H03M 1/10; H03M 1/742; H03M 2201/8144; H03M 1/0604; H03M 1/0863; H03M 1/1057; H03M 1/661; H03M 1/765; H03M 1/785; H03M 2201/518; H03M 2201/814
USPC .................................. 341/135, 136, 144–154
See application file for complete search history.

(56) References Cited

U.S. PATENT DOCUMENTS

| | | | | |
|---|---|---|---|---|
| 5,654,710 | A * | 8/1997 | Oh | H03M 1/002 |
| | | | | 341/136 |
| 5,703,582 | A * | 12/1997 | Koyama | H03M 1/1023 |
| | | | | 341/120 |
| 6,927,714 | B1 | 8/2005 | Teterwak | |
| 7,388,531 | B1 * | 6/2008 | Cyrusian | H03M 1/0604 |
| | | | | 326/93 |
| 7,595,684 | B2 * | 9/2009 | Maejima | G11C 5/145 |
| | | | | 327/536 |
| 7,796,073 | B2 * | 9/2010 | Ogawa | H03K 17/302 |
| | | | | 341/118 |
| 10,073,167 | B2 * | 9/2018 | Venkataraman | G01S 7/484 |
| 2004/0104830 | A1 * | 6/2004 | May | H03M 1/0682 |
| | | | | 341/144 |
| 2004/0135992 | A1 * | 7/2004 | Munro | G01S 7/483 |
| | | | | 356/4.01 |
| 2005/0099328 | A1 | 5/2005 | Kasai | |
| 2007/0091036 | A1 * | 4/2007 | Han | G09G 3/342 |
| | | | | 345/82 |
| 2008/0106477 | A1 * | 5/2008 | Mashima | H01Q 1/243 |
| | | | | 343/702 |
| 2008/0136694 | A1 | 6/2008 | Imai | |
| 2010/0182180 | A1 | 1/2010 | Ikoma et al. | |
| 2010/0289680 | A1 | 11/2010 | Ho et al. | |
| 2010/0321223 | A1 * | 12/2010 | Imai | G05F 3/262 |
| | | | | 341/150 |
| 2011/0273317 | A1 * | 11/2011 | Nagatani | H03M 1/662 |
| | | | | 341/144 |
| 2012/0019405 | A1 | 1/2012 | Nadimpalli et al. | |
| 2013/0214953 | A1 * | 8/2013 | Shiraishi | H03M 1/66 |
| | | | | 341/144 |
| 2013/0278166 | A1 | 10/2013 | Katoh | |
| 2014/0253353 | A1 * | 9/2014 | Singer | H03M 1/0836 |
| | | | | 341/122 |
| 2014/0340150 | A1 | 11/2014 | Dempsey et al. | |
| 2014/0265887 | A1 | 12/2014 | Kamal et al. | |
| 2016/0128146 | A1 * | 5/2016 | Wu | H05B 33/0827 |
| | | | | 315/291 |

FOREIGN PATENT DOCUMENTS

| | | |
|---|---|---|
| CN | 103262652 | 8/2013 |
| CN | 103379687 | 10/2013 |
| DE | 102011006613 | 10/2012 |
| GB | 2492833 | 1/2013 |

OTHER PUBLICATIONS

International Search Report for corresponding PCT Application Serial No. PCT/US2016/033607, dated Aug. 18, 2016 (2 pages).
Chinese Search Report in corresponding Chinese Patent Application No. 2016800401451, dated Aug. 5, 2019 (2 pages).

* cited by examiner

US 10,795,002 B2

HIGH SPEED ILLUMINATION DRIVER FOR TOF APPLICATIONS

CROSS REFERENCE TO RELATED APPLICATIONS

This continuation application claims priority to U.S. patent application Ser. No. 14/856,205, filed Sep. 16, 2015, which application claims priority from India provisional patent application No. 2556/CHE/2015 filed May 22, 2015, both applications of which are hereby incorporated by reference in their entirety.

TECHNICAL FIELD

The present disclosure is generally related to electronic circuits, and more particularly to high speed illumination driver for time-of-flight (TOF) applications.

BACKGROUND

An emerging category of electronic devices is time-of-flight (TOF) systems. The TOF systems find applications in accelerometers, monolithic gyroscopes, light sensors, conveyor belts, depth sensing, proximity sensing, gesture recognition and imagers. A TOF system includes a light source that emits light pulses. The light pulses are emitted towards a target, which reflects the light pulses. The target is any object of interest which may include, but not limited to, a human, an automated component, an animal, an electronic device etc. A TOF sensor in the TOF system receives the reflected light pulses. The TOF sensor receives the reflected light pulses after a time of flight, which is proportional to a distance of the target from the TOF system.

The TOF sensor includes a pixel array having a plurality of pixels. The pixel array receives the reflected light pulses. The pixel array collects light for a predetermined amount of time after the emission of the light by the light source. Light reflected from a far away object travels a longer distance and therefore has a longer time-of-flight, whereas light reflected from a nearby object is received after short time-of-flight. Each pixel in the pixel array generates a signal, which is processed in a processor to extract information about the target. The information includes a level of ambient light and a depth of the target.

The light source in a typical TOF system is a light emitting diode (LED) or a laser module. An illumination driver is required to drive the light source. The illumination driver needs to satisfy multiple conditions to be used in a TOF system. Some of these conditions are: (a) the illumination driver is required to support high current which in one example is in range of 100 mA or more, (b) the illumination driver is required to operate on high modulation frequencies which in one example is in the range of 50 MHz or more so as to achieve good depth accuracy, and (c) the illumination driver is required to have a good phase noise which in one example is of the order of 60-70 dB so as to achieve a good resolution.

Existing illumination drivers does not meet one or more of these conditions. In addition, the existing illumination drivers are affected by thermal noise, flicker noise and large sized circuit elements. The presence of parasitic capacitance further degrades a linear nature of the illumination drivers.

SUMMARY

According to an aspect of the disclosure, a circuit is disclosed. The circuit includes an amplifier and a digital to analog converter (DAC). The amplifier receives a reference voltage at an input node of the amplifier. The DAC is coupled to the amplifier through a refresh switch. The DAC includes one or more current elements. Each current element of the one or more current elements receives a clock. The DAC includes one or more switches corresponding to the one or more current elements. A feedback switch is coupled between the one or more switches and a feedback node of the amplifier. The DAC provides a feedback voltage at the feedback node of the amplifier.

BRIEF DESCRIPTION OF THE VIEWS OF DRAWINGS

Figure 2:
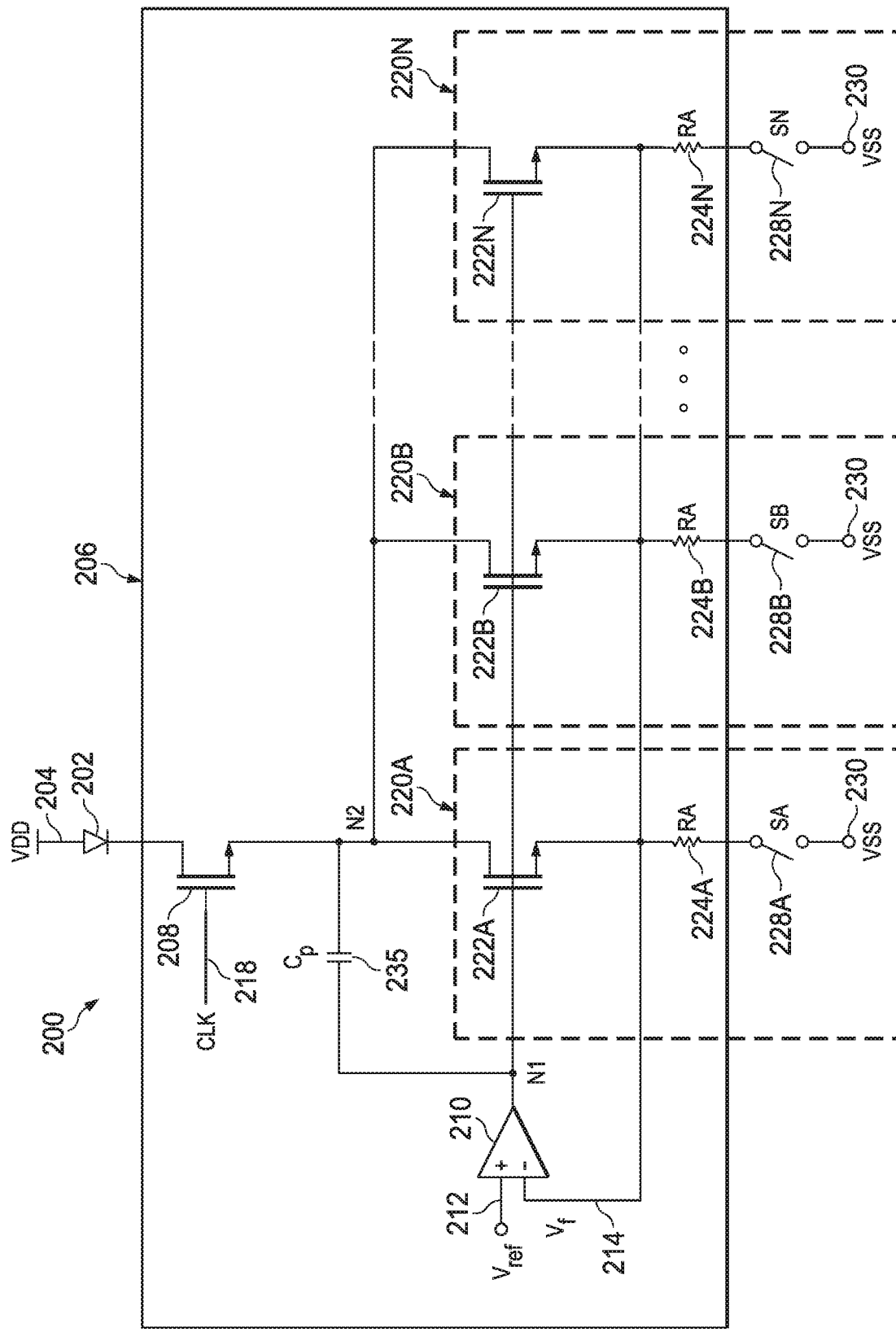
Figure 3:
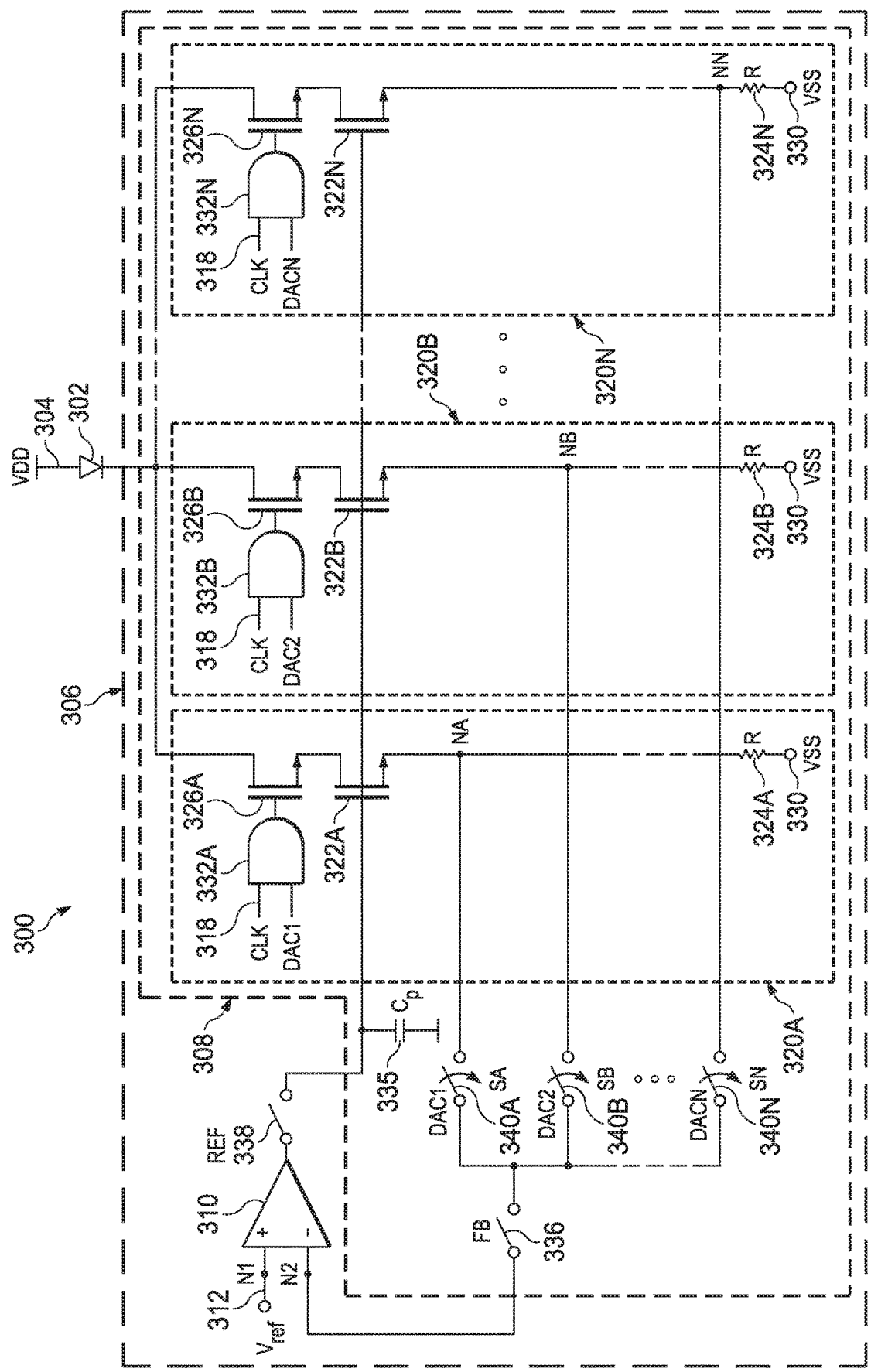
Figure 4:
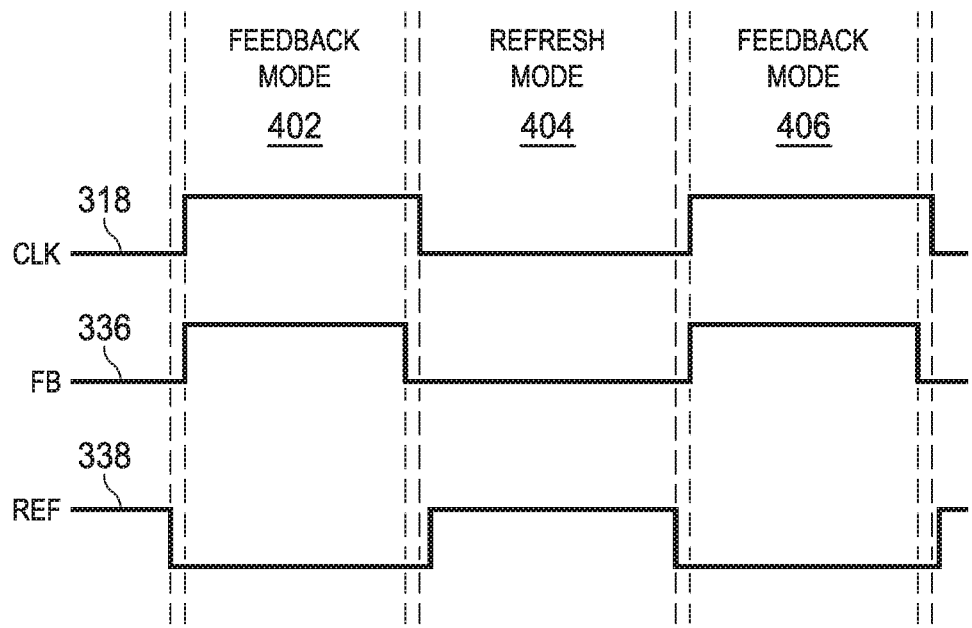
Figure 5:
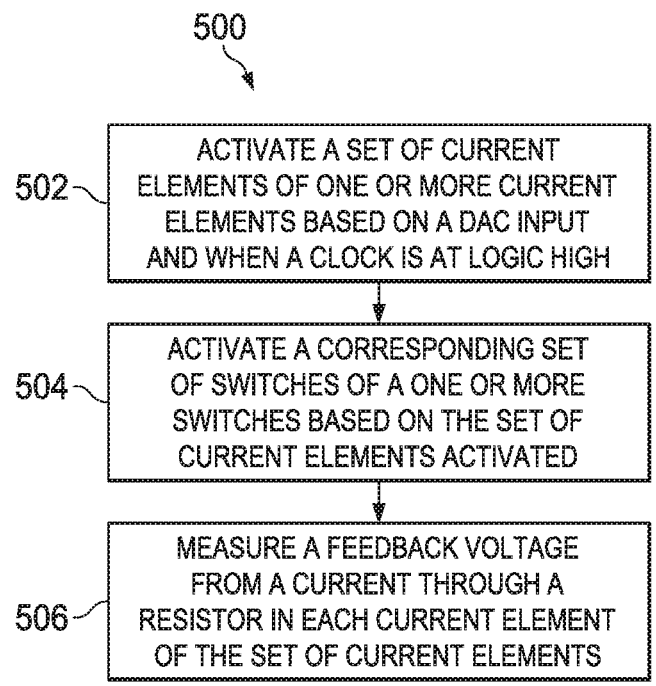
Figure 6:
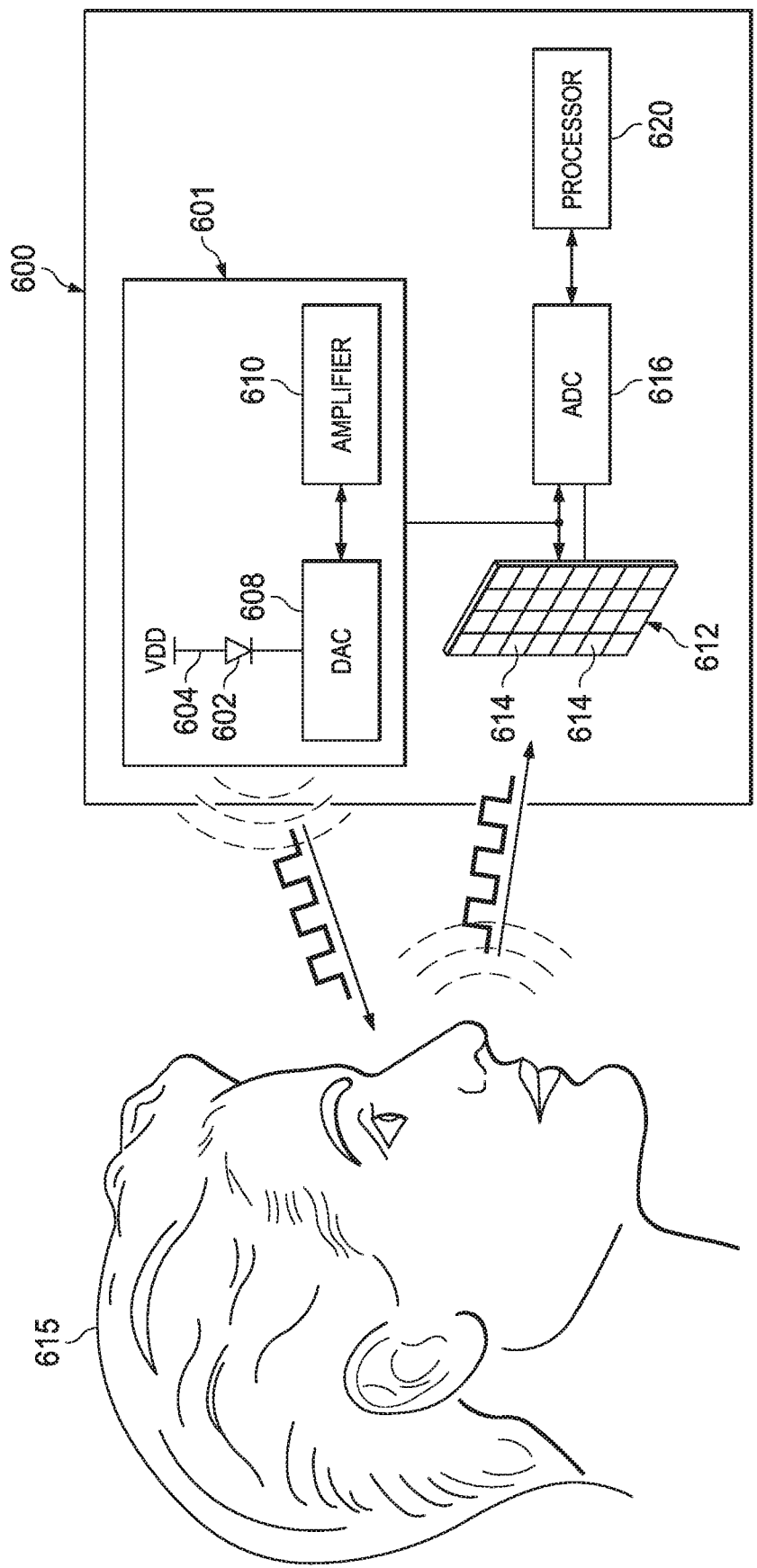

FIG. 1 illustrates a circuit;
FIG. 2 illustrates a circuit;
FIG. 3 illustrates a circuit, according to an embodiment;
FIG. 4 is a timing diagram to illustrate operation of a circuit, according to an embodiment;
FIG. 5 is a flowchart to illustrate a method of operation of a circuit, according to an embodiment; and
FIG. 6 illustrates a time-of-flight (TOF) system, according to an embodiment.

DETAILED DESCRIPTION OF THE EMBODIMENTS

FIG. 1 illustrates a circuit 100. The circuit 100 includes an LED (light emitting diode) 102. The LED 102 is coupled between a primary power source VDD 104 and an illumination driver 106. The illumination driver 106 includes a first transistor 108, a bias generator 110 and a plurality of current elements represented as 120A to 120N. The bias generator 110 includes a current source 112 coupled to a voltage source V. A diode connected transistor 114 is coupled to the current source 112. A drain terminal of the diode connected transistor 114 is coupled to the current source 112, and a gate terminal of the diode connected transistor 114 is coupled to the drain terminal. A bias resistor R 116 is coupled between a source terminal of the diode connected transistor 114 and a secondary power source VSS 130.

The first transistor 108 is coupled between the LED 102 and the plurality of current elements. A gate terminal of the first transistor 108 receives a clock CLK 118, and a drain terminal of the first transistor 108 is coupled to the LED 102. A source terminal of the first transistor 108 is coupled to the plurality of current elements represented as 120A to 120N. Every current element of the plurality of current elements is similar in connection and operation. Hence, for brevity of the description, the connection and operation of the current element 120A is discussed here.

The current element 120A includes a second transistor 122A, an additional resistor RA 124A, and a secondary switch SA 128A coupled to the secondary power source VSS 130. A gate terminal of the second transistor 122A is coupled to the diode connected transistor 114, and a drain terminal of the second transistor 122A is coupled to the source terminal of the first transistor 108 at an output node N2. A source terminal of the second transistor 122A is coupled to the additional resistor RA 124A. The secondary switch SA 128A is coupled between the additional resistor RA 124A and the secondary power source VSS 130.

Similarly, the current element 120N is an Nth current element of the plurality of current elements, where N is an integer. The current element 120N also includes a second transistor 122N, an additional resistor RA 124N, and a secondary switch SN 128N coupled to the secondary power source VSS 130. The secondary switches SA 128A to SN 128N are activated by a digital to analog converter (DAC) input. The DAC input includes a plurality of enables signals. In one example, when an enable signal received by the secondary switch SA 128A is at logic high, the secondary switch SA 128A is activated or closed.

The operation of the circuit 100 illustrated in FIG. 1 is explained now. The illumination driver 106 draws current from the primary power source VDD 104. The current flows through the LED 102 to the illumination driver 106. The LED 102 emits light pulses based on the current drawn by the illumination driver 106 from the primary power source VDD 104. On receiving the DAC input, a set of secondary switches in the current elements 120A to 120N are activated. Thus, based on the DAC input, a set of current elements with the set of secondary switches is activated which draw current from the primary power source VDD 104.

The current source 112 provides current to the diode connected transistor 114 which creates a bias voltage at a bias node N1. The bias voltage at the bias node N1 is used for biasing the second transistors in the set of current elements. Thus, a current flowing through the LED 102 is proportional to the set of current elements activated based on the DAC input. The first transistor 108 is activated when the clock CLK 118 is at logic high.

When the clock CLK 118 is at logic high, a current flows through the LED 102 based on the set of current elements of the plurality of current elements 120A to 120N activated in response to the DAC input. When the clock CLK 118 is at logic low, no current is drawn by the illumination driver 106, and hence no current flows through the LED 102. In an example, when the clock CLK 118 transitions to logic high, if the current flowing through the LED 102 is Ipeak, when the clock CLK 118 transitions to logic low, the current flowing through the LED 102 is much lower than Ipeak. Thus, the current flowing through the LED 102 is not steady and a distortion is introduced in the current flowing through the LED 102 during a time period when the clock CLK 118 is at logic high.

This distortion of current in the LED 102 is because of multiple factors. The current element 120A is discussed here to illustrate these factors, and it is understood that the other current elements of the plurality of current elements behave in a similar manner to compound the distortion of the current in the LED 102. Flicker noise of the current element 120A translates into a phase noise around a frequency of the clock CLK 118. The additional resistor RA 124A aids in reducing the flicker noise. However, achieving the flicker noise specification by increasing a resistance of the additional resistor RA 124A is not possible because of proportional increase in power loss.

Also, a size of the diode connected transistor 114 in the bias generator is less than a size of the second transistor 122A. The bias generator 110 and the current element 120A behave as a current mirror circuit. In one example, when a size of the diode connected transistor 114 is x and the size of the second transistor 122A is 100x, a current flowing through the diode connected transistor 114 is I, and a current flowing through the second transistor 122A is 100x. Thus, the size of the diode connected transistor 114 is maintained much lesser than the size of the second transistor 122A. However, any noise in the diode connected transistor 114 also gets multiplied by a same factor (100 in the above example) as a ratio of size of the diode connected transistor 114 and the second transistor 122A. Thus, the bias generator 110 is required to be designed in a manner to meet the flicker noise specification which proportionately increases a size of the circuit 100.

A parasitic capacitance Cp 135 is introduced between the bias node N1 and the output node N2. The parasitic capacitance Cp 135, in one case, is because of large sized circuit elements in the illumination driver 106. A switching of the plurality of circuit elements because of switching of the clock CLK 118 introduces glitches at the bias node N1. Also, the bias node N1 is not strongly held which causes a variation in the current flowing through the LED 102. All these factors also introduce nonlinearity in the current flowing through the LED 102.

FIG. 2 illustrates a circuit 200. The circuit 200 includes an LED (light emitting diode) 202. The LED 202 is coupled between a primary power source VDD 204 and an illumination driver 206. The illumination driver 206 includes a first transistor 208, an amplifier 210 and a plurality of current elements represented as 220A to 220N. The amplifier 210 receives a reference voltage Vref 212.

The first transistor 208 is coupled between the LED 202 and the plurality of current elements. A gate terminal of the first transistor 208 receives a clock CLK 218, and a drain terminal of the first transistor 208 is coupled to the LED 202. A source terminal of the first transistor 208 is coupled to the plurality of current elements represented as 220A to 220N. Every current element of the plurality of current elements is similar in connection and operation. Hence, for brevity of the description, the connection and operation of the current element 220A is discussed here.

The current element 220A includes a second transistor 222A, an additional resistor RA 224A, and a secondary switch SA 228A coupled to a secondary power source VSS 230. A gate terminal of the second transistor 222A is coupled to the amplifier 210, and a drain terminal of the second transistor 222A is coupled to the source terminal of the first transistor 208 at an output node N2. A source terminal of the second transistor 222A is coupled to the additional resistor RA 224A. The secondary switch SA 228A is coupled between the additional resistor RA 224A and the secondary power source VSS 230.

Similarly, the current element 220N is an Nth current element of the plurality of current elements, where N is an integer. The current element 220N also includes a second transistor 222N, an additional resistor RA 224N, and a secondary switch SN 228N coupled to the secondary power source VSS 230. The secondary switches SA 228A to SN 228N are activated by a digital to analog converter (DAC) input. The DAC input includes a plurality of enables signals. In one example, when an enable signal received by the secondary switch SA 228A is at logic high, the secondary switch SA 228A is activated or closed.

The operation of the circuit 200 illustrated in FIG. 2 is explained now. The illumination driver 206 draws current from the primary power source VDD 204. The current flows through the LED 202 to the illumination driver 206. The LED 202 emits light pulses based on the current drawn by the illumination driver 206 from the primary power source VDD 204. On receiving the DAC input, a set of secondary switches in the current elements 220A to 220N are activated. Thus, based on the DAC input, a set of current elements with the set of secondary switches is activated which draw current from the primary power source VDD 204.

The amplifier 210 generates a bias voltage at a bias node N1. The bias voltage at the bias node N1 is used for biasing the second transistors in the set of current elements. Thus, a current flowing through the LED 202 is proportional to the set of current elements activated based on the DAC input. A feedback voltage Vf 214 is measured from a current through the additional resistors in each current element of the set of current elements. The feedback voltage Vf 214 is provided to the amplifier 210. The amplifier 210 compares the reference voltage Vref 212 and the feedback voltage Vf 214 to generate the bias voltage.

The first transistor 208 is activated when the clock CLK 218 is at logic high. When the clock CLK 218 is at logic high, a current flows through the LED 202 based on the set of current elements of the plurality of current elements 220A to 220N activated in response to the DAC input. When the clock CLK 218 is at logic low, no current is drawn by the illumination driver 206, and hence no current flows through the LED 202. In an example, when the clock CLK 218 transitions to logic high, if the current flowing through the LED 202 is Ipeak, when the clock CLK 218 transitions to logic low, the current flowing through the LED 202 is much lower than Ipeak. Thus, the current flowing through the LED 202 is not steady and a distortion is introduced in the current flowing through the LED 202 during a time period when the clock CLK 218 is at logic high.

This distortion of current in the LED 202 is because of multiple factors. The current element 220A is discussed here to illustrate these factors, and it is understood that the other current elements of the plurality of current elements behave in a similar manner to compound the distortion of the current in the LED 202. Flicker noise of the current element 220A translates into a phase noise around a frequency of the clock CLK 218. However, this flicker noise is suppressed by a gain of the amplifier 210.

A parasitic capacitance Cp 235 is introduced between the bias node N1 and the output node N2. The parasitic capacitance Cp 235, in one case, is because of large sized circuit elements in the illumination driver 206. A bandwidth of the amplifier 210 needs to be increased to compensate transients because of the parasitic capacitance Cp 235. However, a higher bandwidth requires a higher power to pump the amplifier 210. A switching of the plurality of circuit elements because of switching of the clock CLK 218 introduces glitches at the bias node N1. Also, the bias node N1 is not strongly held which causes a variation in the current flowing through the LED 202. All these factors also introduce nonlinearity in the current flowing through the LED 202.

FIG. 3 illustrates a circuit 300, according to an embodiment. The circuit 300 includes an LED (light emitting diode) 302. The LED 302 is coupled between a primary power source VDD 304 and an illumination driver 306. The illumination driver 306 includes an amplifier 310 and a digital to analog converter (DAC) 308. The amplifier 310 receives a reference voltage Vref 312 at an input node N1 of the amplifier 310. The amplifier 310 receives a feedback voltage Vf at a feedback node N2 of the amplifier 310. The DAC 308 provides the feedback voltage Vf to the amplifier 310. The DAC 308 is coupled to the amplifier 310 through a refresh switch REF 338. The DAC 308 includes one or more current elements illustrated as 320A, 320B to 320N, one or more switches illustrated as SA 340A, SB 340B to SN 340N, and a feedback switch FB 336.

Each current element of the one or more current element receives a clock CLK 318. The one or more switches SA 340A, SB 340B to SN 340N corresponds to one or more current elements 320A, 320B to 320N. Thus, a first switch of the one or more switches is activated when a first current element of the one or more current elements is activated, the first switch corresponds to the first current element. For example, the switch SA 340A corresponds to the current element 320A, and the switch SB 340B corresponds to the current element 320B. Thus, the switch SA 340A is activated when the current element 320A is activated, and the switch SB 340B is activated when the current element 320B is activated. The feedback switch FB 336 is coupled between the one or more switches SA 340A, SB 340B to SN 340N and the feedback node N2 of the amplifier 310.

The DAC 308 receives a DAC input. The DAC input includes one or more enable signals illustrated as DAC1, DAC2 to DACN. The one or more enable signals DAC1, DAC2 to DACN corresponds to one or more current elements 320A, 320B to 320N. For example, the current element 320A receives the enable signal DAC1, and the current element 320B receives the enable signal DAC2. When the enable signal is at logic high, it activates the corresponding current element. For example, the current element 320A is activated when the enable signal DAC1 is at logic high.

Every current element of the one or more current elements 320A, 320B to 320N is similar in connection and operation. Hence, for brevity of the description, the connection and operation of the current element 320A is discussed here. The current element 320A includes an AND gate 332A, a first transistor 326A, a second transistor 322A, and a resistor R 324A coupled to a secondary power source VSS 330. The AND gate 332A receives the clock CLK 318 and the enable signal DAC1 and generates a control signal.

A gate terminal of the first transistor 326A is coupled to the AND gate 332A and receives the control signal, and a drain terminal of the first transistor 326A is coupled to the LED 302. A source terminal of the first transistor 326A is coupled to the second transistor 322A. A gate terminal of the second transistor 322A is coupled to the amplifier 310 through the refresh switch REF 338, and a drain terminal of the second transistor 322A is coupled to the source terminal of the first transistor 326A. A source terminal of the second transistor 322A is coupled to the resistor R 324A at a primary node NA. One end of the resistor R 324A is coupled to the secondary power source VSS 330.

Similarly, the current element 320N is an Nth current element of the plurality of current elements, where N is an integer. The current element 320N also includes an AND gate 332N, a first transistor 326N, a second transistor 322N, and a resistor R 324N coupled to the secondary power source VSS 330. The AND gate 332N receives the clock CLK 318 and the enable signal DACN and generates a control signal.

Each switch of the one or more switches SA 340A, SB 340B to SN 340N is coupled between the primary node (NA, NB to NN) and the feedback switch FB 336. For example, the switch SA 340A is coupled between the primary node NA and feedback switch FB 336. Each switch of the one or more switches SA 340A, SB 340B to SN 340N is activated by the one or more enable signal. For example, when the enable signals DAC1 and DACN are at logic high, the enable signal DAC1 activates the switch SA 340A, and similarly, the enable signal DACN activates the switch SN 340N.

The operation of the circuit 300 illustrated in FIG. 3 is explained now. The illumination driver 306 draws current from the primary power source VDD 304. The current flows through the LED 302 to the illumination driver 306. The LED 302 emits light pulses based on the current drawn by the illumination driver 306 from the primary power source VDD 304. On receiving the DAC input, a set of current elements is activated which draw current from the primary power source VDD 304.

The circuit 300 operates in a feedback mode and a refresh mode. In the feedback mode, the feedback switch FB 336 is activated, and the refresh switch REF 338 is inactivated. The clock CLK 318 is at logic high. A set of current elements of the one or more current elements 320A, 320B to 320N is activated based on the DAC input. For example, the set of current elements 320A and 320B are activated when the enable signals DAC1 and DAC2 are at logic high respectively. When both the clock CLK 318 and enable signal DAC1 are at logic high, the control signal generated by the AND gate 332A activates the first transistor 326A. A corresponding set of switches of the one or more switches SA 340A, SB 340B to SN 340N is activated based on the set of current elements activated. For example, the switch SA 340A is activated when the current element 320A is activated, and the switch SB 340B is activated when the current element 320B is activated.

Thus, a current flowing through the LED 302 is proportional to the set of current elements activated based on the DAC input. The feedback voltage Vf at the feedback node N2 of the amplifier 310 is measured from a current through the resistor in each current element of the set of current elements. For example, when the set of current elements 320A and 320B are activated, the feedback voltage Vf is measured from a current through the resistors R 324A and R 324B.

The refresh mode is explained now. In the refresh mode, the feedback switch FB 336 is inactivated, and the refresh switch REF 338 is activated. The clock CLK 318 is at logic low. When the clock CLK 318 is at logic low, no current is drawn by the illumination driver 306, and hence no current flows through the LED 302. The amplifier 310 generates an error voltage from the feedback voltage Vf and the reference voltage Vref 312. In one example, the error voltage is a difference in the feedback voltage Vf and the reference voltage Vref 312. In another example, the error voltage is an amplified difference in the feedback voltage Vf and the reference voltage Vref 312. In yet another example, the amplifier 310 compares the feedback voltage Vf and the reference voltage Vref 312 to generate the error voltage. The error voltage is provided to a second transistor in each current element of the set of current elements. For example, the set of current elements 320A and 320B are activated in the feedback mode. Thus, in the refresh mode, the second transistors 322A and 322B receives the error voltage from the amplifier 310. The error voltage is provided to other second transistors as well but since the corresponding current elements are inactivated, it did not effect on the current through the LED 302.

The error voltage changes a current through each current element of the set of current elements in a subsequent feedback mode. Thus, in the above example, when the set of current elements 320A and 320B are activated in a subsequent feedback mode, the error voltage changes a current through the current elements 320A and 320B.

A parasitic capacitance Cp 335 introduces glitch in the error voltage. However, any glitch introduced in the error voltage changes a current through the set of current elements which is again fed back to the amplifier 310 for correction. Thus, a current flowing through the set of current elements is a function of the reference voltage Vref 312 and the resistor in each current element of the set of current elements. The circuit 300 provides one or more switches SA 340A, SB 340B to SN 340N in a feedback path of the amplifier 310. This reduces the area requirement of the circuit 300. In one example, the area requirement is reduced by 30% as compared to the circuit 100.

Also, a resistance of the one or more switches SA 340A, SB 340B to SN 340N does not affect the operation of the circuit 300 since there is no current through the one or more switches SA 340A, SB 340B to SN 340N. A bandwidth of the amplifier 310 is low as compared to the amplifier 210 illustrated in FIG. 2. Thus, a lower power is required to drive the amplifier 310, and hence a lower power is required to realize high modulation frequency in the illumination driver 306.

FIG. 4 is a timing diagram to illustrate operation of a circuit, according to an embodiment. The timing diagram illustrates operation of the circuit 300. In a feedback mode 402, the feedback switch FB 336 is activated, and the refresh switch REF 338 is inactivated. The clock CLK 318 is at logic high. A set of current elements of the one or more current elements 320A, 320B to 320N is activated based on the DAC input. A corresponding set of switches of the one or more switches SA 340A, SB 340B to SN 340N is activated based on the set of current elements activated. The feedback voltage Vf at the feedback node N2 of the amplifier 310 is measured through a current through the resistor in each current element of the set of current elements.

The feedback switch FB 336 is inactivated before the clock CLK 118 transitions to logic low. In a refresh mode, the feedback switch FB 336 is inactivated, and the refresh switch REF 338 is activated. The clock CLK 318 is at logic low. When the clock CLK 318 is at logic low, no current is drawn by the illumination driver 306, and hence no current flows through the LED 302. The amplifier 310 generates an error voltage from the feedback voltage Vf and the reference voltage Vref 312. In one example, the error voltage is a difference in the feedback voltage Vf and the reference voltage Vref 312. In another example, the error voltage is an amplified difference in the feedback voltage Vf and the reference voltage Vref 312. The error voltage is provided to a second transistor in each current element of the set of current elements. For example, the set of current elements 320A and 320B are activated in the feedback mode 402. Thus, in the refresh mode 404, the second transistors 322A and 322B receives the error voltage from the amplifier 310.

The error voltage changes a current through each current element of the set of current elements in a subsequent feedback mode 406. Thus, in the above example, when the set of current elements 320A and 320B are activated in a subsequent feedback mode 406, the error voltage changes a current through the current elements 320A and 320B.

FIG. 5 is a flowchart 500 to illustrate a method of operation of a circuit, according to an embodiment. The flowchart 500 is explained in connection with the circuit 300. At step 502, a set of current elements of one or more current elements is activated based on a DAC input and when a clock is at logic high. In circuit 300, a set of current elements of the one or more current elements 320A, 320B to 320N is activated based on the DAC input. The DAC input includes one or more enable signals (represented as DAC1, DAC2 to DACN in FIG. 3) corresponding to the one or more current elements. For example, the set of current elements 320A and 320B are activated when the enable signals DAC1 and DAC2 are at logic high respectively.

At step 504, a corresponding set of switches of one or more switches is activated based on the set of current elements activated. For example, the switch SA 340A is activated when the current element 320A is activated, and the switch SB 340B is activated when the current element 320B is activated. The one or more enable signals activates the one or more switches. For example, the switch SA 340A is activated by the enable signal DAC1, and the switch SB 340B is activated by the enable signal DAC2. A feedback voltage is measured from a current through a resistor in each current element of the set of current elements, at step 506. For example, when the set of current elements 320A and 320B are activated, the feedback voltage Vf is measured from a current through the resistors R 324A and R 324B. Thus, a current flowing through the LED 302 is proportional to the set of current elements activated based on the DAC input. A primary power source provides current to each current element of the set of current elements.

The one or more current elements are inactivated when the clock is at logic low. The feedback voltage Vf and a reference voltage are compared to generate an error voltage. The error voltage is provided to each current element of the one or more current elements. The set of current elements of the one or more current elements is activated when the clock is at logic high. The error voltage is configured to change a current through each current element of the set of current elements. Thus, in the above example, when the set of current elements 320A and 320B are activated, the error voltage changes a current through the current elements 320A and 320B.

FIG. 6 illustrates a time-of-flight (TOF) system 600, according to an embodiment. The TOF system 600 includes a circuit 601. The circuit 601 includes an LED (light emitting diode) 602. The LED 602 is coupled between a primary power source VDD 604 and a digital to analog converter (DAC) 608. In one example, the LED 602 is an infrared (IR) LED that transmits IR light. The circuit 601 includes an amplifier 610 coupled to the DAC 608.

The TOF system 600 includes a pixel array 612. The pixel array 612 includes one or more pixels illustrated as 614. The pixel array 612 is coupled to an analog to digital converter (ADC) 616. A processor 620 is coupled to the ADC 616. The processor 620 can be, for example, a CISC-type (Complex Instruction Set Computer) CPU, RISC-type CPU (Reduced Instruction Set Computer), or a digital signal processor (DSP).

The circuit 601 is similar to the circuit 300 in connection and operation. The amplifier 610 receives a reference voltage Vref at an input node of the amplifier 610. The amplifier 610 receives a feedback voltage Vf at a feedback node of the amplifier 610. The DAC 608 provides the feedback voltage Vf to the amplifier 610. The DAC 608 is coupled to the amplifier 610 through a refresh switch. The DAC 608 includes one or more current elements, one or more switches, and a feedback switch.

The circuit 601 provides one or more switches in a feedback path of the amplifier 610. This reduces the area requirement of the circuit 601. A bandwidth of the amplifier 610 is low as compared to the amplifier 210 illustrated in FIG. 2. Thus, a lower power is required to drive the amplifier 610, and hence a lower power is required to realize high modulation frequency in the circuit 601.

The LED 602 transmit light pulses based on a current drawn by the DAC 608 from the primary power source VDD 604. The transmitted light pulses are scattered by a target 615 to generate reflected light pulses. The pixel array 612 receives the reflected light pulses. The ADC 616 converts an analog signal from each pixel of the plurality of pixels to a digital signal. The processor 620 processes the digital signal to generate an image of the target 615.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A circuit comprising a digital to analog converter (DAC), the DAC comprising:
    one or more current elements, each current element of the one or more current elements configured to receive a clock;
    one or more switches corresponding to the one or more current elements, wherein a set of current elements of the one or more current elements are activated based on a DAC input and the clock, and a set of switches of the one or more switches are activated based on the DAC input; and
    a feedback switch coupled to the one or more switches.

2. The circuit of claim 1 further comprising
    an LED (light emitting diode) coupled between a primary power source and the DAC; and
    an amplifier coupled to the DAC through a refresh switch and configured to receive a reference voltage at an input node of the amplifier, wherein the feedback switch is coupled between the one or more switches and a feedback node of the amplifier.

3. The circuit of claim 2, wherein the DAC is configured to provide a feedback voltage at the feedback node of the amplifier, and wherein the feedback voltage is measured from a current through a resistor in each current element of the set of current elements.

4. The circuit of claim 3, wherein the DAC receives the DAC input, the DAC input comprises one or more enable signals corresponding to the one or more current elements, wherein a current element of the one or more current elements is activated when a corresponding enable signal received by the current element is at logic high.

5. The circuit of claim 4, wherein each current element of the one or more current element comprises:
    an AND gate configured to generate a control signal in response to the clock and an enable signal of the one or more enable signals;
    a first transistor configured to receive the control signal; and
    a second transistor coupled to the first transistor and the refresh switch, wherein the resistor is coupled to the second transistor at a primary node, and one end of the resistor is coupled to a secondary power source.

6. The circuit of claim 4, wherein the one or more enable signals is configured to activate the one or more switches.

7. The circuit of claim 5, wherein each switch of the one or more switches is coupled between the primary node and the feedback switch.

8. The circuit of claim 6, wherein a first switch of the one or more switches is activated when a first current element of the one or more current elements is activated, wherein the first switch corresponds to the first current element.

9. The circuit of claim 5 operates in a feedback mode and a refresh mode, wherein in the feedback mode:
    the feedback switch is activated;
    the refresh switch is inactivated;
    the clock is at logic high;
    the set of current elements of the one or more current elements is activated based on the DAC input; and
    a corresponding set of switches of the one or more switches is activated based the set of current elements activated.

10. The circuit of claim 9, wherein in the refresh mode:
the feedback switch is inactivated;
the refresh switch is activated;
the clock is at logic low; and
the amplifier is configured to generate an error voltage from the feedback voltage and the reference voltage, the error voltage is provided to the second transistor in each current element of the set of current elements.

11. The circuit of claim 10, wherein the error voltage is configured to change a current through each current element of the set of current elements in a subsequent feedback mode.

12. A method comprising:
activating a feedback switch;
inactivating a refresh switch;
activating a set of current elements of one or more current elements based on a DAC input and when a clock is at logic high;
activating a corresponding set of switches of a one or more switches based on the set of current elements activated; and
measuring a feedback voltage from a current through a resistor in each current element of the set of current elements.

13. The method of claim 12 further comprising:
inactivating the one or more current element when the clock is at logic low;
inactivating the feedback switch;
comparing the feedback voltage and a reference voltage to generate an error voltage
activating the refresh switch;
providing the error voltage to each current element of the one or more current elements; and
activating the set of current elements of the one or more current elements when the clock is at logic high, wherein the error voltage is configured to change a current through each current element of the set of current elements.

14. The method of claim 12 further comprising providing a current from a primary power source to each current element of the set of current elements.

15. The method of claim 12, wherein activating the set of current elements of the one or more current elements further comprises receiving the DAC input, the DAC input comprises one or more enable signals corresponding to the one or more current elements, wherein the one or more enable signals is configured to activate the one or more switches.

16. The method of claim 15, wherein each current element of the one or more current element comprises:

an AND gate configured to generate a control signal in response to the clock and an enable signal of the one or more enable signals;
a first transistor configured to receive the control signal; and
a second transistor coupled to the first transistor, wherein the resistor is coupled to the second transistor at a primary node, and one end of the resistor is coupled to a secondary power source.

17. A time-of-flight (TOF) system comprising a circuit, the circuit configured to transmit light pulses, the circuit includes a digital to analog converter (DAC), the DAC comprising:
one or more current elements configured to receive a DAC input, each current element of the one or more current elements configured to receive a clock; and
one or more switches corresponding to the one or more current elements, wherein a set of current elements of the one or more current elements are activated based on the DAC input and the clock, and a set of switches of the one or more switches are activated based on the DAC input.

18. The TOF system of claim 17, wherein the circuit further comprises:
an LED (light emitting diode) coupled between a primary power source and the DAC; and
an amplifier coupled to the DAC through a refresh switch and configured to receive a reference voltage at an input node of the amplifier.

19. The TOF system of claim 18, wherein the DAC further comprises a feedback switch coupled between the one or more switches and a feedback node of the amplifier, and wherein the DAC is configured to provide a feedback voltage at the feedback node of the amplifier, and wherein the feedback voltage is measured from a current through a resistor in each current element of the set of current elements.

20. The TOF system of claim 17 further comprising:
a pixel array having a plurality of pixels configured to receive reflected light pulses, the transmitted light pulses are scattered by a target to generate the reflected light pulses;
an analog to digital converter (ADC) coupled to the pixel array and configured to convert an analog signal from each pixel of the plurality of pixels to a digital signal; and
a processor coupled to the ADC, and configured to process the digital signal.

* * * * *